US011475192B1

(12) United States Patent
Roy et al.

(10) Patent No.: US 11,475,192 B1
(45) Date of Patent: Oct. 18, 2022

(54) METHODS AND APPARATUS FOR BUFFERED ASSERTION REPORTING IN EMULATION

(71) Applicant: Cadence Design Systems, Inc., San Jose, CA (US)

(72) Inventors: Manik Chandra Roy, Haryana (IN); Rajiv Roy, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 3 days.

(21) Appl. No.: 17/030,007

(22) Filed: Sep. 23, 2020

(51) Int. Cl.
*G06F 11/07* (2006.01)
*G06F 30/331* (2020.01)
*G06F 9/54* (2006.01)

(52) U.S. Cl.
CPC ............ *G06F 30/331* (2020.01); *G06F 9/544* (2013.01); *G06F 9/546* (2013.01)

(58) Field of Classification Search
CPC ......... G06F 30/331; G06F 9/544; G06F 9/546
See application file for complete search history.

(56) References Cited

U.S. PATENT DOCUMENTS

| 10,437,748 | B1* | 10/2019 | Shalev | ............... G06F 13/4027 |
| 2003/0182653 | A1* | 9/2003 | Desoli | ............... G06F 9/45504 |
| | | | | 717/138 |
| 2017/0161403 | A1* | 6/2017 | Mustafa | ............... G06F 30/3323 |

OTHER PUBLICATIONS

Donggyu Kim et al. "DESSERT: Debugging RTL Effectively with State Snapshotting for Error Replays across Trillions of cycles", 2018 (Year: 2018).*
Sumit Ghosh. "Asynchronous, Distributed Event Driven Simulation Algorithm with Inconsistent Event Preemption for Accurate Execution of VHDL Descriptions on Parallel Processors" (Year: 2001).*

* cited by examiner

*Primary Examiner* — Timothy A Mudrick
*Assistant Examiner* — Abdou K Seye
(74) *Attorney, Agent, or Firm* — Foley & Lardner LLP (57) ABSTRACT

Systems and methods for IC chip design testing can include a hardware emulator, having circuitry to emulate functionalities of an integrated circuit chip design and a buffer, detecting an assertion failure event indicative of a failed assertion on one of the functionalities, and storing a message indicative of the assertion failure event in the buffer. The circuitry can transfer, asynchronously relative to execution of the hardware emulator, the message from the buffer to a software host device without halting the execution of the hardware emulator. The software host device can receive the message indicative of the assertion failure event, and execute, asynchronously relative to the execution of the hardware emulator, at least one fail action instruction associated with the assertion failure event.

20 Claims, 4 Drawing Sheets

METHODS AND APPARATUS FOR BUFFERED ASSERTION REPORTING IN EMULATION

TECHNICAL FIELD

The present disclosure relates generally to systems, devices and methods for buffered assertion reporting in emulation, including but not limited to an assertion failure reporting model that avoids wall clock time overhead by buffering assertion failure messages and executing a fail action block asynchronously relative to execution of a hardware emulator.

BACKGROUND

The IEEE Standard 1800-2017 requires a chip testing tool or system to report assertion failures and execute of a respective fail action block for each assertion failure. The IEEE Standard 1800-2017 mandates the reporting of the assertion failure event and the execution of the respective fail action block at the same simulation time at which the assertion has failed. To model this behavior in emulation every assertion failure need to trigger hardware-software (HW-SW) synchronization (TBSYNC) for reporting that assertion failure event. That is, the hardware emulation is halted when the reporting of the assertion failure event and the execution of the respective fail action block are performed.

SUMMARY

The present embodiments relate to an integrated circuit (IC) design testing environment or model that involves buffering assertion failure events by a hardware emulator, and executing corresponding fail action blocks by a software host in an asynchronous manner relative to the execution of the emulator. Specifically, the execution of the emulator is not halted when the software host is executing the fail action blocks. Also, the software host can execute the fail action blocks at a later time (e.g., asynchronously) relative to the time instances at which the assertion failure events are detected.

According to some aspects, embodiments relate to a system comprising a hardware emulator and a software host device. The hardware emulator can include circuitry to emulate functionalities of an integrated circuit chip design, and a buffer. The software host device can include at least one processor to execute instructions for the hardware emulator. The circuitry can detect an assertion failure event indicative of a failed assertion on one of the functionalities, and store a message indicative of the assertion failure event in the buffer. The circuitry can transfer, asynchronously relative to execution of the hardware emulator, the message from the buffer to the software host device without halting the execution of the hardware emulator. The software host device can receive the message indicative of the assertion failure event, and execute, asynchronously relative to the execution of the hardware emulator, at least one fail action instruction associated with the assertion failure event.

The circuitry can include a field programmable gate array (FPGA) circuit. The integrated circuit chip design can include a design for an application-specific integrated circuit (ASIC). The message can include a timestamp indicative of a time instance at which the assertion failure event occurred. The software host can determine, according to the message, the at least one fail action instruction associated with the assertion failure event. In some implementations, executing the fail action block can include generating an error message indicative of the failed assertion in a report or log file.

The circuitry can include a first circuitry to emulate functionalities of the integrated circuit chip design, and a second circuitry configured to detect assertion failure events corresponding to failed assertions on the functionalities. The buffer can be a first-in-first-out (FIFO) buffer, and the message can be asynchronously transferred to the software host device according to a FIFO order. The hardware emulator can include a plurality of buffers, and can be configured to store messages indicative of assertion failure events in the plurality of buffers. In some implementations, transferring the message from the buffer to the software host device can include the software host device polling the message from the buffer.

According to some aspects, embodiments relate to a method of buffered assertion reporting. The method can include detecting, by a hardware emulator comprising circuitry to emulate functionalities of an integrated circuit chip design, an assertion failure event indicative of a failed assertion on one of the functionalities. The method can include the hardware emulator storing a message indicative of the assertion failure event in a buffer. The method can include the hardware emulator transferring, asynchronously relative to execution of the hardware emulator, the message from the buffer to a software host device without halting the execution of the hardware emulator. The software host device can include at least one processor to execute instructions for the hardware emulator. The method can include the software host device executing, asynchronously relative to the execution of the hardware emulator, at least one fail action instruction associated with the assertion failure event.

The circuitry can include a field programmable gate array (FPGA) circuit. The integrated circuit chip design can include a design for an application-specific integrated circuit (ASIC). The message can include a timestamp indicative of a time instance at which the assertion failure event occurred. The method can further include the software host determining, according to the message, the at least one fail action instruction associated with the assertion failure event. In some implementations, executing the fail action block can include generating an error message indicative of the failed assertion in a report or log file.

The circuitry can include a first circuitry to emulate functionalities of the integrated circuit chip design, and a second circuitry configured to detect assertion failure events corresponding to failed assertions on the functionalities. The buffer can be a first-in-first-out (FIFO) buffer, and the message can be asynchronously transferred to the software host device according to a FIFO order. The hardware emulator can include a plurality of buffers, and can be configured to store messages indicative of assertion failure events in the plurality of buffers. In some implementations, transferring the message from the buffer to the software host device can include the software host device polling the message from the buffer.

BRIEF DESCRIPTION OF THE DRAWINGS

These and other aspects and features of the present embodiments will become apparent to those ordinarily skilled in the art upon review of the following description of specific embodiments in conjunction with the accompanying figures, wherein.

DETAILED DESCRIPTION

The present embodiments will now be described in detail with reference to the drawings, which are provided as illustrative examples of the embodiments so as to enable those skilled in the art to practice the embodiments and alternatives apparent to those skilled in the art. Notably, the figures and examples below are not meant to limit the scope of the present embodiments to a single embodiment, but other embodiments are possible by way of interchange of some or all of the described or illustrated elements. Moreover, where certain elements of the present embodiments can be partially or fully implemented using known components, only those portions of such known components that are necessary for an understanding of the present embodiments will be described, and detailed descriptions of other portions of such known components will be omitted so as not to obscure the present embodiments. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the present disclosure is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present embodiments encompass present and future known equivalents to the known components referred to herein by way of illustration.

In a HW-SW co-simulation environment, a compiler can insert a combinational virtual (or global) logic to detect an assertion failure and trigger a hardware emulator stop condition at the same simulation time step. The combinational virtual logic significantly constrains the compiler by triggering HW-SW synchronization (TBSYNC) on assertion failures. The virtual logic to detect assertion failure can results in a longer critical path, and reduces the maximum emulator operating frequency, especially for a design with a relatively large number of assertions (e.g., more than hundred thousand assertions) compared to a design without assertions. The handling of a HW-SW synchronization (TBSYNC) event can include context switching, which is a time consuming mechanism. That is, the emulation time is halted during processing of each assertion failure event and is resumed on completion of the fail action block execution, therefore, contributing to runtime slowdown due to wall clock time overhead. Every assertion failure event leads to a corresponding wall clock time overhead, which is incurred due to the IEEE Standard 1800-2017 requirement of reporting assertion failure and execution of the fail action block at the same emulation time at which the assertion has failed.

The HW-SW synchronization (TBSYNC) event handling consumes significant wall clock time as a result of the wall clock time overhead on every assertion failure during runtime. The hardware emulator spends the clock time overhead in detecting the assertion failures, and triggering HW-SW synchronization (TBSYNC) for reporting assertion failure events and executing fail action blocks on the software host. Each TBSYNC can take several microseconds of wall clock time. As such, the global virtual logic to detect assertion failure contributes to a critical path, which in turn reduces the emulator operation frequency. In a worst case scenario, e.g., a design with more than half million system Verilog assertions (SVAs), the emulator operating frequency can be reduced to half of the emulator operating frequency for a scenario without SVA. In general, the total wall clock time overhead depends on the total number of assertions failure events in the design. As the number of assertions increases, the combinational virtual (or global) logic causes longer critical path and a more significant reduction of the maximum operating frequency.

As the design size increases, customers want to use emulation technology extensively to verify their design for longer design cycles, and leverage the advantage of system Verilog assertion (SVA) methodologies. However, the increase in design size calls for an increase in the number of system Verilog assertions (SVAs), and therefore, an increase in total wall clock time overhead. The relaxation of the constraint to execute the action block in the same time step of the failed assertion and the scalability of SVA in a design can allow for extensive use of emulation technology and longer verification of the design. Specifically, handling assertion failure events and executing corresponding fail action blocks in an asynchronous manner, without halting the execution of the emulator, reduces the critical path and increases the maximum operating frequency, therefore allowing for more extensive and efficient design testing for longer design cycles. In the current disclosure, systems, apparatuses and methods for circuit design testing can relax or avoid the requirement for HW-SW synchronization (TB SYNC), and employ a buffered reporting model.

Figure 1:
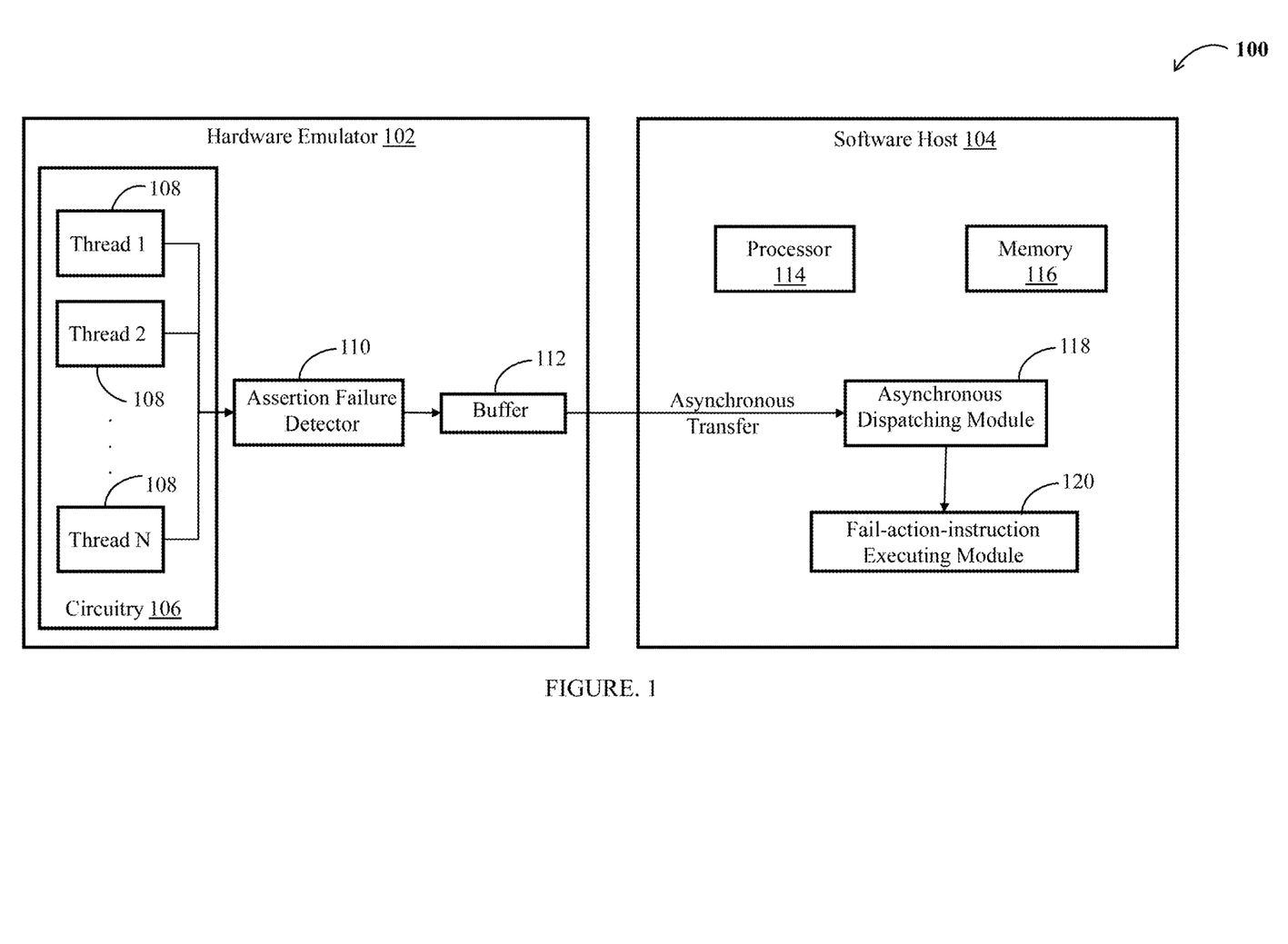
FIG. 1 shows a block diagram illustrating a system for hardware emulation employing asynchronous handling of assertion failure events, according to present embodiments.

FIG. 1 shows a block diagram illustrating a system 100 for hardware emulation employing asynchronous handling of assertion failure events, according to at least one example embodiment. The system 100 can include a hardware emulator 102 and a software host device 104. The hardware emulator 102 can include a circuitry 106 to emulate functionalities or threads 108 of an integrated circuit chip design. The hardware emulator 102 can include one or more assertion failure detectors 110 and one or more buffers 112. The software host device 104 can include a processor 114 and a memory 116 to store computer code instructions for execution by the processor 114. The software host device 104 can include an asynchronous dispatching module 118 and a fail-action-instruction executing module 120. The hardware emulator 102 and the software host device 104 can be communicatively coupled to each other.

The circuitry 106 of the hardware emulator 102 can emulate functionalities of an integrated circuit (IC) chip design. An IC can include millions of transistors that are connected together to form a circuit integrated into a chip. Given the cost of manufacturing IC chips for a given circuit, the logic design of the circuit is usually tested before the manufacturing process starts. The testing can include dividing the logic design into a plurality of functional blocks, and checking or verifying the functionality of each functional block. The IC chip can include an application-specific integrated circuit (ASIC), and the corresponding logic design can include a design for the ASIC. Checking the functionality of each functional block can include feeding various inputs to the logic design and checking the corresponding outputs at logic gates of the functional blocks. The testing of the logic design can include performing static time analysis (STA) to check various time delays associated with the logic design or corresponding functional blocks, and verify whether the time delays meet predefined design constraints.

The circuitry 106 can be configured, e.g., reprogrammed, to mimic the functionality of the logic design or the IC of interest (e.g., to be manufactured). The circuitry 106 can include a field programmable gate array (FPGA) circuit. The threads 108 can represent various functional blocks of the logic design. The circuitry 106 can execute the threads 108 sequentially, in parallel or according to a combination of sequential and parallel execution patterns. The use of the circuitry 106 allows for a practical and cost effective testing of the logic design before manufacturing the corresponding IC chip. Specifically, the circuitry 106 allows for checking or verifying the functionalities of the various functional blocks of the logic design before manufacturing the IC chip.

A compiler of the circuitry 106 and/or the hardware emulator 102 can insert and/or implement various combinational virtual (or global) logics to act as functional traps. In some implementations, the combinational virtual (or global) logics can be inserted in association with the various functional blocks to check the functionalities of such blocks. For instance, each combinational virtual (or global) logic can be arranged or configured to act as a functional trap for a corresponding functional block of the logic design. In some implementations, each combinational logic can be implemented using logic gates with relatively insignificant time delay, such as AND, OR, NOT, NAND, NOR, XOR or XNOR gates. The output of each combinational logic can be used to check whether the corresponding functional block is operating according to a corresponding desired (or predefined) functionality.

The hardware emulator 102 can include one or more assertion failure detectors 110 for detecting assertion failure events. Each assertion failure detector 110 can be configured to check the output of a corresponding functional trap (or corresponding combinational logic). In some implementations, the hardware emulator 102 can include a single assertion failure detector 110 configured to check the outputs of all the functional traps or the corresponding combinational logics. In some implementations, the assertion failure detector(s) 110 can include the combinational logics inserted by the compiler. In some implementations, the circuitry 106 can include the one or more assertion failure detectors 110. For instance, the circuitry 106 can include a first circuitry to emulate functionalities of the integrated circuit chip design, and a second circuitry representing the assertion failure detector(s) 110 and configured to detect assertion failure events corresponding to failed assertions on the functionalities. In some implementations, the assertion failure detector(s) 110 can be implemented as one or more software modules or a combination of hardware and software modules.

The assertion failure detector(s) 110 can monitor and check the output of each combinational logic (or functional trap) to detect any corresponding failure. The output of each combinational logic can represent an assert statement that is used to enforce a predefined property of the logic design. The assertion failure detector(s) 110 can detect an assertion failure event upon determining that the property for a given assert statement (or the output of a given combinational logic or functional trap) is evaluated to be false (e.g., equal to zero). If the property for the assert statement is evaluated to true (e.g., equal to one), then the assertion failure detector(s) 110 detects a successful assertion event.

Upon detecting an assertion failure event, the assertion failure detector(s) 110 can store (or cause storing of) a corresponding message indicative of the assertion failure event in the buffer(s) 112. The message can include an indication of at least one fail action instruction associated with the assertion failure event. The at least one fail action instruction associated with the assertion failure event or the respective indication can be stored or maintained in a memory (not shown in FIG. 1) of the hardware emulator 102. Upon detecting the assertion failure event, the assertion failure detector(s) 110 can retrieve the at least one fail action instruction or the respective indication from the memory for storing in the buffer(s) 112. The message can include a timestamp indicative of a time instance at which the assertion failure event occurred. The assertion failure detector(s) 110 can generate the timestamp upon detecting the assertion failure event, and store the timestamp in the buffer(s) 112.

The hardware emulator 102, or the assertion failure detector(s) 110, can be configured to relax/avoid/circumvent the IEEE Std. 1800-2017 mandated requirement of handling assertion failure events at the same emulation time at which the assertion failure event is detected. As such, upon detecting an assertion failure event, the hardware emulator 102 or the assertion failure detector(s) 110 does not halt execution of the emulation. Instead, execution of the emulation can continue even when an assertion failure event is detected or when the software host device 104 executes the corresponding fail action instruction(s).

The buffer(s) 112 can store a respective message for each detected assertion failure event. Each of the buffer 112 can be a first-in-first-out (FIFO) buffer. In some implementations, the hardware emulator 102 can include a single buffer, e.g., a single FIFO buffer. The hardware emulator 102, or the buffer(s) 112, can asynchronously transfer the message(s) stored in the buffer(s) 112 to the software host device 104. Specifically, the transfer of the message(s) is not synchronized with execution of the emulation and does not involve or require halting execution of the emulation. In the case of FIFO buffer(s) 112, the hardware emulator 102, or the buffer(s) 112, can transfer the message(s) to the software host device 104 according to a FIFO order. In some implementations, transferring the message(s) from the buffer 112 can include the software host device 104 polling the message(s) from the buffer(s) 112. For instance, the software host device 104 can regularly poll or query the hardware emulator 102 or the respective buffer(s) 112 for any message(s) stored in the buffer(s) 112. In response, the hardware emulator 102 or the buffer(s) 112 can transfer a message, if any is stored in the buffer(s) 112, to the software host device 104.

The software host device 104 can include a desktop, laptop, hardware computer server, tablet device, other handheld device, or other computing device. The processor 114 can include a microprocessor, a multi-core processor, a digital signal processor (DSP) or other type of computer processor. The memory 116 can include a cache memory, a random-access memory (RAM), a read-only memory (ROM), an external memory device, or other type of memory. The memory 116 can be accessible by the processor 114, and can store computer instructions that are executable by the processor 114. For instance, the computer instructions can include instructions for causing the processor 114 to regularly poll the hardware emulator 102 or the buffer(s) 112 for messages stored in the buffer(s) 112 and indicative of corresponding assertion failure events. The computer instructions can include instructions to cause the processor 114 to read and process messages received from the hardware emulator 102, and/or execute fail action instructions or blocks associated with the received message(s) or the corresponding assertion failure event(s).

The software host device 104 can include the asynchronous dispatching module 118 and the fail-action-instruction executing module 120. Each of the asynchronous dispatching module 118 and the fail-action-instruction executing module 120 can be implemented as a software module, a hardware module or a combination of both. For instance, each of the asynchronous dispatching module 118 and the fail-action-instruction executing module 120 can be implemented as software instructions executable by the processor 114. The asynchronous dispatching module 118 can receive message(s) from the buffer(s) 112, read or process the received message(s), and/or trigger execution of the corresponding fail action instructions or blocks. For instance, the asynchronous dispatching module 118 can read or process the received message(s), and determine or identify the corresponding fail action instructions or blocks to be executed. The asynchronous dispatching module 118 can retrieve from each received message corresponding fail action instructions or blocks or an indication thereof. The asynchronous dispatching module 118 can provide the fail action instructions (or blocks) or the respective indication to the fail-action-instruction executing module 120.

The fail-action-instruction executing module 120 can execute the fail action instructions (or blocks) corresponding to each received message or each detected assertion failure event. The fail action instructions or blocks executed by the fail-action-instruction executing module 120 can include non-synthesizable tasks have constructs like $display and/or $error to accurately identify the failing assertions and design states to help debug the failure. Such tasks can be specified in the message received from the hardware emulator 102, or the respective buffer(s) 112, or can be automatically inserted by the software host device 104 or the processor 114, for example, according to specifications of the IEEE Std. 1800-2017. In executing the fail action instructions or block, the fail-action-instruction executing module 120 can generate an error message indicative of the failed assertion in a report or log file. In some implementations, the fail-action-instruction executing module 120 can write generated error messages in the report or log file according to an order defined based on timestamps included in corresponding messages received from the hardware emulator 102. For instance, the error messages associated with the assertion failure events can be ordered in the report or log file according to an ascending order of the timestamps associated with the assertion failure events. The fail-action-instruction executing module 120 can display the generated error messages on a display device.

Figure 2:
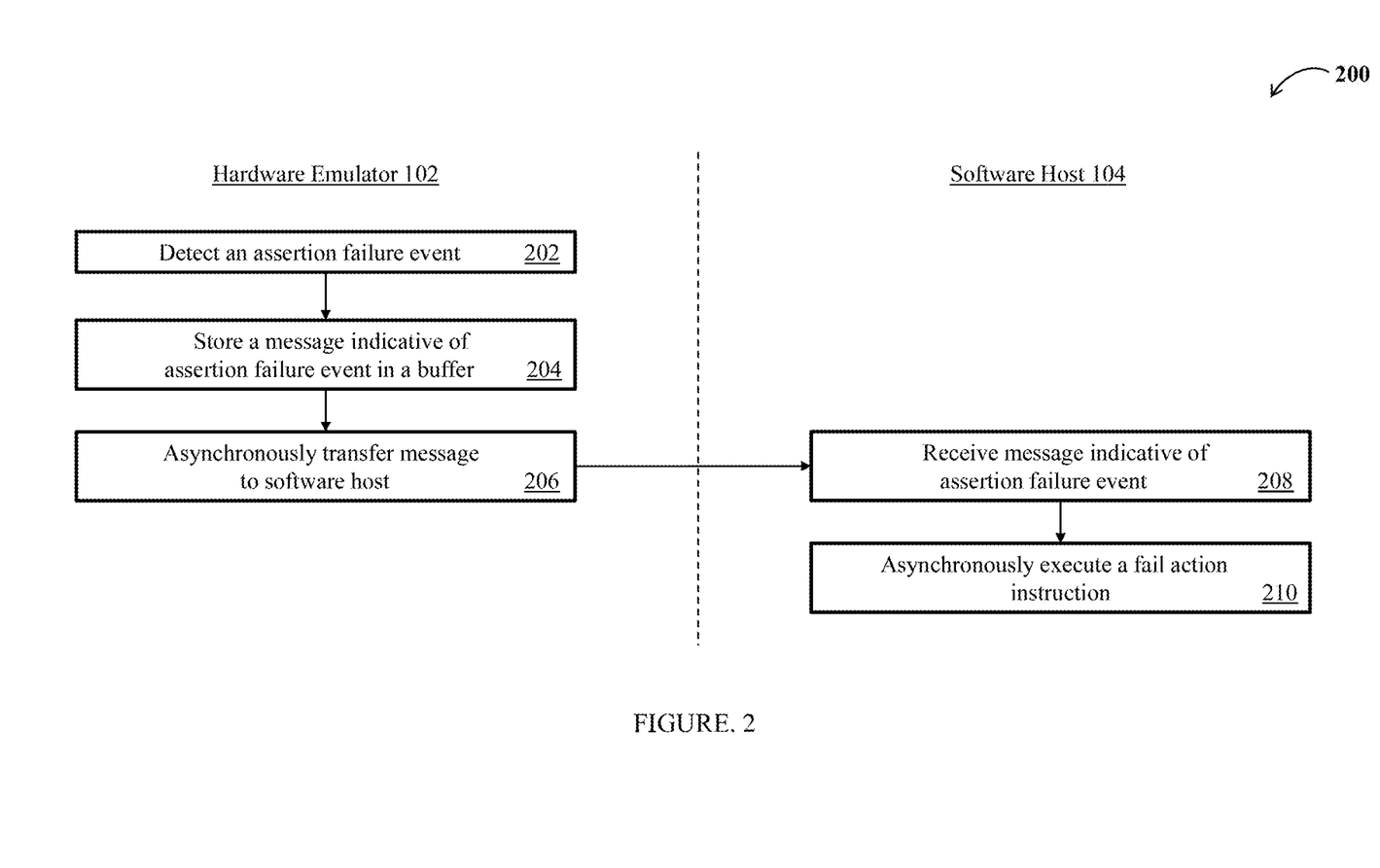
FIG. 2 shows a flowchart illustrating a method of buffered assertion reporting in hardware emulation, according to the present embodiments.

FIG. 2 shows a flowchart illustrating a method 200 of buffered assertion reporting in hardware emulation, according to at least one example embodiment. The method 200 can include a hardware emulator, such as hardware emulator 102, detecting an assertion failure event (STEP 202), and storing a message indicative of the assertion failure event in a buffer (STEP 204). The method 200 can include the hardware emulator 102 asynchronously transferring the message to a software host device, such as software host device 104 (STEP 206). The method 200 can include the software host device 104 receiving the message indicative of the assertion failure event (STEP 208), and asynchronously executing a fail action instruction (STEP 210).

The method 200 can include the hardware emulator 102 detecting an assertion failure event (STEP 202). As discussed above with regard to FIG. 1, the hardware emulator 102 can include circuitry 106, such as an FPGA circuit, to emulate functionalities of an IC chip design. The IC chip design can include a design for an ASIC. A compiler of the circuitry 106 or the hardware emulator 102 can insert functional traps, e.g., as combinational virtual (or global) logics, in association with various functional blocks of the chip design. The hardware emulator 102 can monitor assertion statements, e.g., associated with or representing outputs of the combinational logics. The hardware emulator 102 can detect an assertion failure event upon determining that the property for a given assert statement is evaluated to be false (e.g., equal to zero). In some implementations, the circuitry 106 can include a first circuitry to emulate functionalities of the IC chip design, and a second circuitry configured to detect assertion failure events corresponding to failed assertions on the functionalities.

The method 200 can include the hardware emulator 102 storing a message indicative of the assertion failure event in a buffer, such as buffer 112, of the hardware emulator 102 (STEP 204). Upon detecting the assertion failure event, the hardware emulator 102 can store a corresponding message indicative of the assertion failure event in the buffer 112. The message can include at least one fail action instruction (or a fail action block) associated with the assertion failure event, or an indication of the at least one fail action instruction (or the fail action block). The message can include a timestamp indicative of a time instance (e.g., according to simulation time) at which the assertion failure event occurred. The hardware emulator 102 can generate the message upon detecting the assertion failure event. Generating the message can include retrieving the at least one fail action instruction (or the fail action block) or the respective indication from a memory, generating the timestamp, and inserting the timestamp and the at least one fail action instruction (or the fail action block) or the respective indication in the message. As discussed above with regard to FIG. 1, the buffer 112 can include a FIFO buffer.

The method 200 can include the hardware emulator 102 asynchronously transferring the message to the software host device 104 (STEP 206). The hardware emulator 102 can be configured to continue execution of the emulation upon detecting an assertion failure event, and transfer the message to the software host device 104 asynchronously relative to execution of the emulation or the hardware emulator 102. By not halting execution of the emulation, the testing of the IC chip design can be relatively faster. In the case where buffer 112 is a FIFO buffer, the hardware emulator 102 can transfer messages from the buffer 112 to the software host device 104 according to a FIFO order. That is, the hardware emulator 102 can transfer messages from the buffer 112 to the software host device 104, e.g., according to the order of storing the same messages in the buffer 112 and/or according to the timestamps corresponding to the messages. In some implementations, the hardware emulator 102 can include a plurality of buffers 112, and the hardware emulator 102 can store messages indicative of assertion failure events in the plurality of buffers 112.

In some implementations, transferring messages from the buffer 112 to the software host device 104 can include the software host device 104 polling the buffer 112 for messages stored therein. For instance, the software host device 104 can regularly poll or query the hardware emulator 102 or the buffer 112 for messages, and in response, the hardware emulator 102 or the buffer 112 can transfer the next message in line, if any is stored in the buffer 112, to the software host device 104 for handling therein. The transfer of messages from the buffer 112 to the software host device does not affect (or does not halt) execution of the emulation.

The method 200 can include the software host device 104 receiving the message indicative of the assertion failure event from the hardware emulator 102 (STEP 208). Upon receiving the message, the software host device 104 can read the message and identify one or more corresponding fail action instructions based on the message. For instance, the software host device 104 can retrieve the one or more corresponding fail action instructions or an indication thereof from the message. If the message includes an indication of the one or more fail action instructions, the software host device 104 can use the indication, for example, to retrieve the fail action instruction(s) from a memory of the software host device 104, such as memory 116. The software host device 104 can retrieve the timestamp indicative of the time instance at which the assertion failure event occurred from the message.

The method 200 can include the software host device 104 asynchronously executing a fail action instruction (STEP 210). The software host device 104 can execute the fail action instruction(s) (or a fail action block) determined based on the message received from the hardware emulator 102. The fail action instruction(s) (or block) can include tasks for accurately identifying the failing assertion and related design states to help debug the failure. The tasks can have constructs like $display and/or $error. The tasks can be specified in the message received from the hardware emulator 102, or can be automatically inserted by the software host device 104 or the processor 114, for example, according to specifications of the IEEE Std. 1800-2017.

In executing fail action instructions (or blocks) associated with various messages received from the hardware emulator 102, the software host device 104 can generate a report or log file including error messages indicative failed assertions associated with various assertion failure events. The software host device 104 can order the error messages in the report or log file according to timestamps associated with the corresponding assertion failure events. For instance, the software host device 104 can order the error messages in the report or log file according to an ascending order of the timestamps associated with the assertion failure events. In some implementations, the software host device 104 can display the error messages on a display device.

Figure 3:
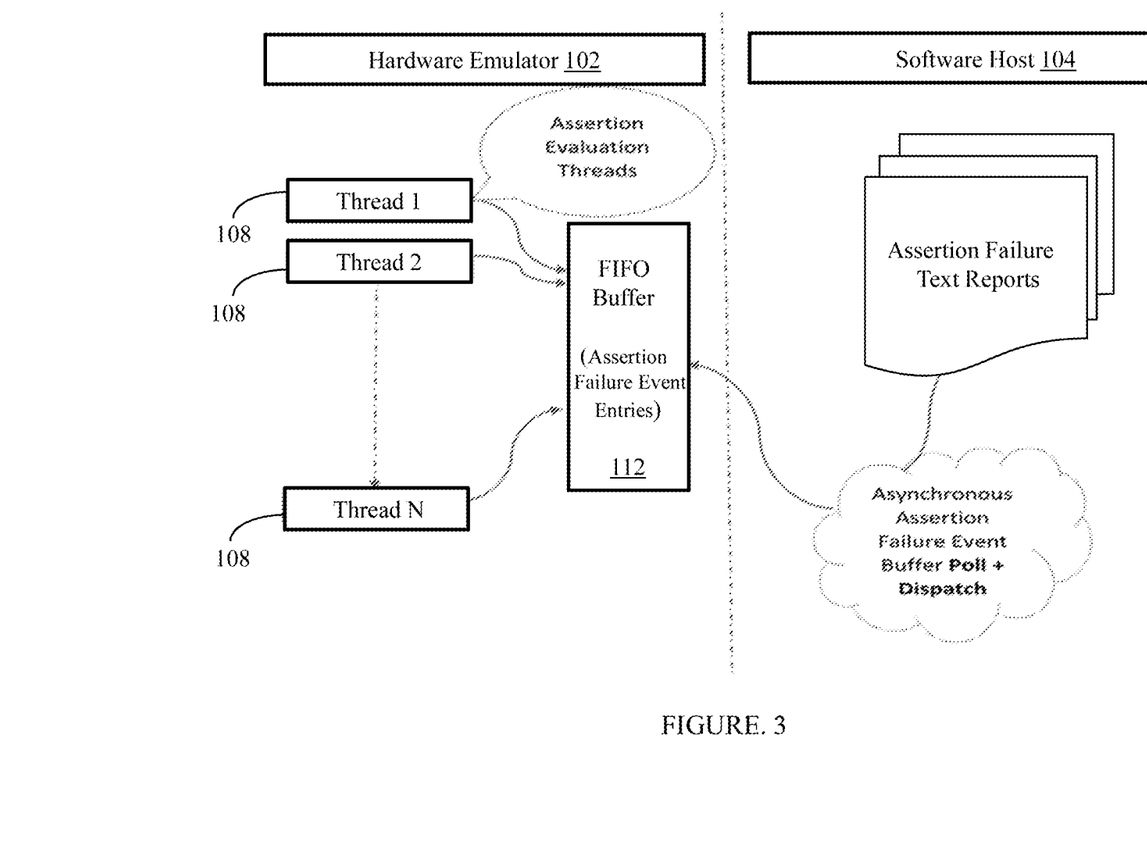
FIG. 3 shows a diagram illustrating an example buffered assertion reporting model, according to present embodiments.

FIG. 3 shows a diagram illustrating an example buffered assertion reporting model depicting an example implementation of the method 200, according to an example embodiment. The hardware emulator 102 can store entries of detected assertion failure events in a FIFO buffer 112 of the hardware emulator 102. The software host device 104 can poll messages from the FIFO buffer 112 in an asynchronous manner relative to the execution of the emulation of the functionalities of the IC chip design. The software host device 104 can asynchronously, relative to the execution of the emulation of the functionalities of the IC chip design, generate one or more reports or log files including error messages indicative of the failed assertions associated with various assertion failure events.

Figure 4:
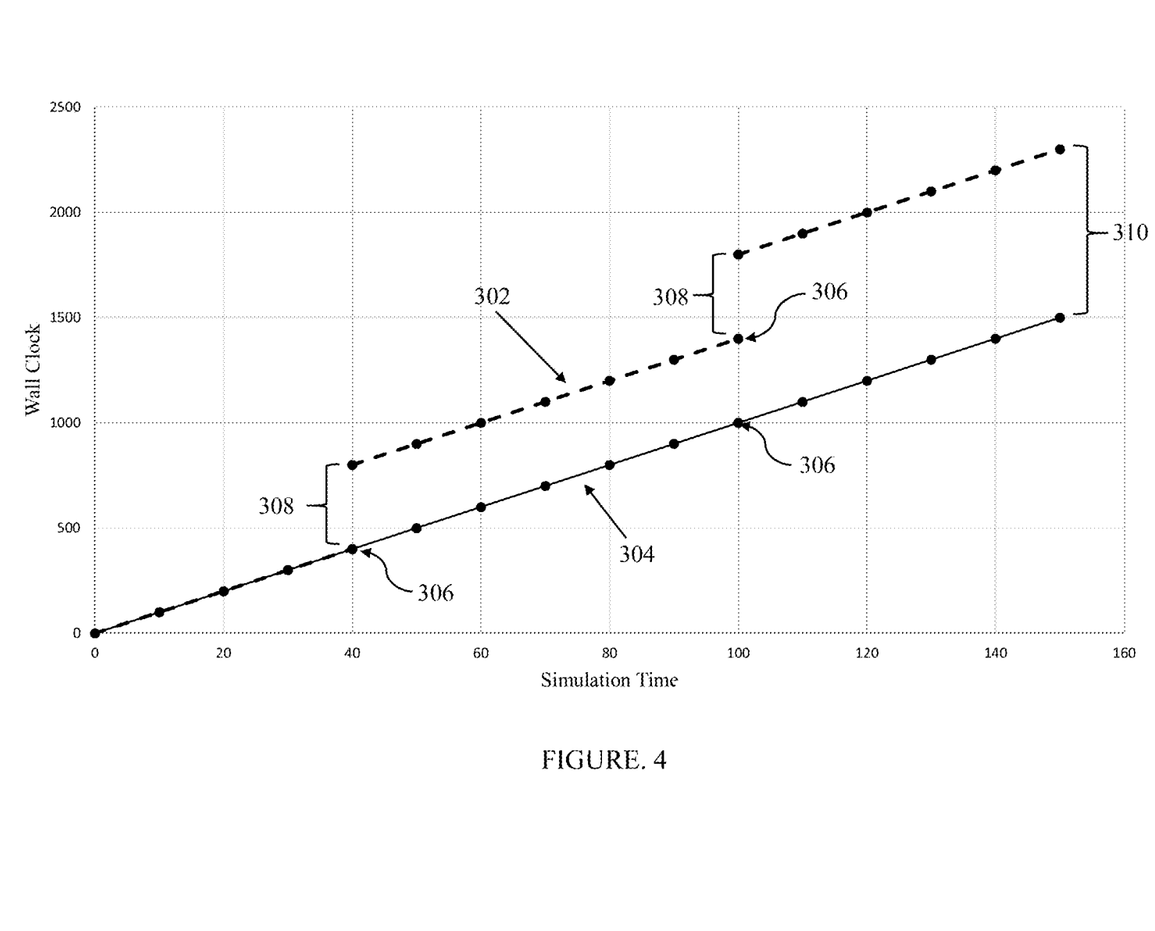
FIG. 4 shows plots illustrating reduction in wall clock time overhead when using buffered assertion reporting, according to the present embodiments.

FIG. 4 shows plots illustrating reduction in wall clock time overhead when using buffered assertion reporting, according to an example embodiment. Plot 302 represents wall clock time as a function of simulation time for a HW-SW co-simulation scenario in accordance with the IEEE Std. 1800-2017. Plot 304 represents wall clock time as a function of simulation time for a buffered assertion reporting scenario as described with regard to method 200 of FIG. 2. The dots in the plots 302 and 304 represent events of evaluating assertion statements. The dots 306 represent assertion failure events. Each of the differences 308 represents a wall clock time overhead due to a corresponding HW-SW synchronization event. The total wall clock time overhead 310 illustrates the reduction in wall clock time when using buffered assertion reporting compared to HW-SW co-simulation in accordance with the IEEE Std. 1800-2017.

The buffered assertion reporting approach described herein leads to significant reduction in wall clock time, and therefore, an increase in emulator operating frequency especially for IC chip designs with relative large sizes. As the size of the IC chip designs increases, so does the number of assertions. For instance, it's very common to find more than 100K System Verilog Assertions (SVAs) even in designs having about 100 million gates. Also, the increase in the number of SVAs can lead to an increase in the number of expected assertion failure events. When applying HW-SW co-simulation in accordance with the IEEE Std. 1800-2017, each assertion failure event can result in a corresponding wall clock time overhead. Therefore, using buffered assertion reporting leads to avoiding a large number wall clock time overheads. The buffered assertion reporting approach results in a significant reduction in total wall clock time equal to the cumulative sum of the individual wall clock time overheads associated with individual SW-HW synchronization events of the co-simulation approach of the IEEE Std. 1800-2017.

Although the present embodiments have been particularly described with reference to preferred ones thereof, it should be readily apparent to those of ordinary skill in the art that changes and modifications in the form and details may be made without departing from the spirit and scope of the present disclosure. It is intended that the appended claims encompass such changes and modifications.

What is claimed is:

1. A system comprising:
 a hardware emulator comprising circuitry to emulate functionalities of an integrated circuit chip design, and a buffer; and
 a software host device comprising at least one processor to execute instructions for the hardware emulator,
 the circuitry configured to:
  detect an assertion failure event indicative of a failed assertion on one of the functionalities;
  store a message indicative of the assertion failure event in the buffer; and
  transfer, asynchronously relative to a time of detection of the assertion failure event, the message from the buffer to the software host device without halting the execution of the hardware emulator,
 the software host device configured to:
  receive the message indicative of the assertion failure event; and
  execute, asynchronously relative to the time of detection of the assertion failure event and while the execution of the hardware emulator is running, at least one fail action instruction associated with the assertion failure event.

2. The system of claim 1, wherein the circuitry includes a field programmable gate array (FPGA) circuit.

3. The system of claim 1, wherein the integrated circuit chip design comprises a design for an application-specific integrated circuit (ASIC).

4. The system of claim 1, wherein the message includes a timestamp indicative of a time instance at which the assertion failure event occurred.

5. The system of claim 1, wherein the software host is configured to determine, according to the message, the at least one fail action instruction associated with the assertion failure event.

6. The system of claim 1, wherein executing the fail action block includes generating an error message indicative of the failed assertion, in a report or log file.

7. The system of claim 1, wherein the circuitry comprises a first circuitry to emulate functionalities of the integrated circuit chip design, and a second circuitry configured to detect assertion failure events corresponding to failed assertions on the functionalities.

8. The system of claim 1, wherein the buffer is a first-in-first-out (FIFO) buffer, the message asynchronously transferred to the software host device according to a FIFO order.

9. The system of claim 1, wherein the hardware emulator includes a plurality of buffers and is configured to store messages indicative of assertion failure events in the plurality of buffers.

10. The system of claim 1, wherein transferring the message from the buffer to the software host device includes the software host device polling the message from the buffer.

11. A method comprising:
    detecting, by a hardware emulator comprising circuitry to emulate functionalities of an integrated circuit chip design, an assertion failure event indicative of a failed assertion on one of the functionalities;
    storing, by the hardware emulator, a message indicative of the assertion failure event in a buffer;
    transferring, by the hardware emulator and asynchronously relative to a time of detection of the assertion failure event, the message from the buffer to a software host device without halting the execution of the hardware emulator, the software host device comprising at least one processor to execute instructions for the hardware emulator; and
    executing, by the software host device, asynchronously relative to the time of detection of the assertion failure event and while the execution of the hardware emulator is running, at least one fail action instruction associated with the assertion failure event.

12. The method of claim 11, wherein the circuitry includes a field programmable gate array (FPGA) circuit.

13. The method of claim 11, wherein the integrated circuit chip design comprises a design for an application-specific integrated circuit (ASIC).

14. The method of claim 11, wherein the message includes a timestamp indicative of a time instance at which the assertion failure event occurred.

15. The method of claim 11, further comprising determining, by the software host according to the message, the at least one fail action instruction associated with the assertion failure event.

16. The method of claim 11, wherein executing the fail action block includes generating an error message indicative of the failed assertion, in a report or log file.

17. The method of claim 11, wherein the circuitry comprises a first circuitry to emulate functionalities of the integrated circuit chip design, and a second circuitry configured to detect assertion failure events corresponding to failed assertions on the functionalities.

18. The method of claim 11, wherein the buffer is a first-in-first-out (FIFO) buffer and the message is asynchronously transferred to the software host device according to a FIFO order.

19. The method of claim 11, wherein the hardware emulator includes a plurality of buffers, the method comprising storing messages indicative of assertion failure events in the plurality of buffers.

20. The method of claim 11, wherein transferring the message from the buffer to the software host device includes the software host device polling the message from the buffer.

* * * * *